(12) United States Patent
Wischnewskiy et al.

(10) Patent No.: US 11,114,954 B2
(45) Date of Patent: Sep. 7, 2021

(54) ULTRASONIC MOTOR HAVING GENERATORS FORMED OF COOPERATING AND SPACED APART FIRST AND SECOND SUB-GENERATORS

(71) Applicant: Physik Instrumente (PI) GmbH & Co. KG, Karlsruhe (DE)

(72) Inventors: Wladimir Wischnewskiy, Rathenow (DE); Alexej Wischnewski, Wörth (DE)

(73) Assignee: PHYSIK INSTRUMENTE (PI) GMBH & CO. KG, Karlsruhe (DE)

( * ) Notice: Subject to any disclaimer, the term of this patent is extended or adjusted under 35 U.S.C. 154(b) by 367 days.

(21) Appl. No.: 16/288,658

(22) Filed: Feb. 28, 2019

(65) Prior Publication Data

US 2019/0273449 A1 Sep. 5, 2019

(30) Foreign Application Priority Data

Mar. 5, 2018 (DE) .......................... 102018104928.5

(51) Int. Cl.
*H02N 2/02* (2006.01)
*H01L 41/09* (2006.01)
*H02N 2/08* (2006.01)

(52) U.S. Cl.
CPC ............. *H02N 2/026* (2013.01); *H01L 41/09* (2013.01); *H02N 2/08* (2013.01)

(58) Field of Classification Search
CPC .......... H02N 2/026; H02N 2/08; H02N 2/002; H02N 2/0075; H01L 41/09
See application file for complete search history.

(56) References Cited

U.S. PATENT DOCUMENTS 6,081,063 A 6/2000 Kasuga et al.
7,075,211 B1 * 7/2006 Ganor ................. H01L 41/0913
310/317

(Continued)

FOREIGN PATENT DOCUMENTS

DE 102004024656 A1 12/2005
DE 102012022146 A1 5/2014
WO 2009109606 A1 9/2009

OTHER PUBLICATIONS

German Examination Report dated Oct. 8, 2018.

*Primary Examiner* — Emily P Pham
(74) *Attorney, Agent, or Firm* — Buchanan Ingersoll & Rooney PC

(57) ABSTRACT

An ultrasonic motor and method are disclosed with an element to be driven and a plate-shaped ultrasonic actuator made of polarized electromechanical material with at least two friction elements arranged on one of its side. The ultrasonic actuator can include at least two generators for acoustic standing waves and each of the generators can include two cooperating and spaced sub-generators, and one respective sub-generator of a generator is located between the sub-generators of an adjacent generator, and the sub-generators of one generator are arranged in mirror image to the sub-generators of an adjacent generator. A polarization direction of the electromechanical material of one of the two sub-generators of one generator differs from the polarization direction of the electromechanical material of the other sub-generator of the same generator.

14 Claims, 12 Drawing Sheets

(56) References Cited

U.S. PATENT DOCUMENTS

| | | |
|---|---|---|
| 7,211,929 B2 | 5/2007 | Ganor et al. |
| 8,344,592 B2 * | 1/2013 | Wischnewskly ....... H02N 2/006 |
| | | 310/323.02 |
| 2017/0214339 A1 * | 7/2017 | Wischnewskiy ....... H02N 2/026 |

* cited by examiner

ULTRASONIC MOTOR HAVING GENERATORS FORMED OF COOPERATING AND SPACED APART FIRST AND SECOND SUB-GENERATORS

BACKGROUND

Ultrasonic motors are used, for example, in miniaturized electromechanical systems in order to move or adjust with high precision, for example, optical lenses or lens groups, objectives, magnetic or optical heads of memory devices, as well as miniaturized control tables.

To realize the motion of the respective element to be driven, ultrasonic motors have ultrasonic actuators. Ultrasonic actuators are electromechanical energy converters which, with the application of suitable electrical voltages, perform periodic deformations which can be used to move the element to be driven. The transmission of the respective mechanical energy of the ultrasonic actuator to the element to be driven typically takes place with the aid of a friction element. The power developed by the drive depends inter alia on the size of the contact surface between the friction element and the element to be driven. Ways to increase the contact surface are given by using the same ultrasonic actuators simultaneously or in parallel, by enlarging the dimension of the friction elements, or by increasing the number of friction elements.

Ultrasonic motors with piezoceramic ultrasonic actuators are known, for example, from publications U.S. Pat. Nos. 6,081,063 A and 7,211,929 B2. In these motors, the ultrasonic actuator is configured as a piezoceramic plate, which is tuned to the excitation of the first longitudinal and the second flexing mode of vibrations. To drive the element to be driven, these motors comprise a friction element which is arranged on one of the face surfaces of the ultrasonic actuator. A drawback of using only one friction element is that such an ultrasonic actuator contacts the element to be driven only with a very small surface, which may possibly only be punctiform, resulting in a mechanically unstable drive system. The reason for this is that the ultrasonic actuator tends to tilt or twist with each acceleration or deceleration of the element to be driven. As a result, the respective momentary contact surface between the friction element and the element to be driven changes, which leads to an overall unstable operation of the ultrasonic motor. The force developed by the ultrasonic actuator then varies abruptly. The configuration of the control of such a drive system is difficult and complex. It is possible to remedy this, for example, with complicated actuator holders which, however, make the ultrasonic motor more expensive.

An ultrasonic actuator with a resonator designed as a piezoceramic plate is known from publication WO 2009/109606 A1. The mode of operation of this actuator is based on the excitation of a substantially two-dimensional (i.e., planar) asymmetric acoustic standing wave. An embodiment is disclosed therein in which two friction elements are arranged on the same side surface of the actuator. This results ideally in an increased drive force and a mechanically more stable drive system. According to the teaching of WO 2009/109606 A1, it is provided that the friction elements vibrate synchronously and simultaneously contact or drive the element to be driven. Further ultrasonic actuators of a similar type are known from DE 10 2004 024 656 A1 and DE 10 2012 022 146 A1.

In piezoceramic ultrasonic actuators with several friction elements, however, it is only possible with great effort to obtain precisely the same vibration amplitude or vibration speed of the two friction elements, inter alia due to production-related inhomogeneities and geometric tolerances of the resonator body or the ultrasonic actuator, respectively. In reality, only a more or less synchronous vibration motion of the friction elements arises which under certain circumstances causes the drive motions of the two friction elements to interfere with each other, which can lead to friction losses, squeaking noises or deceleration of the element to be driven. This results in a drive performance that is less than theoretically could be expected when using two friction elements.

SUMMARY

The invention is therefore based on the object of providing an ultrasonic motor, in the ultrasonic actuator of which such an acoustic standing wave can be excited, in which the specific distribution of the vibration amplitudes of points on the ultrasound actuator surface makes it possible to move friction elements arranged thereon such that they vibrate asynchronously in a defined manner, so that there is no mutual interference with respect to the drive motion and the force developed by the ultrasonic actuator is maximized.

An ultrasonic motor is therefore assumed, comprising an element to be driven and an ultrasonic actuator made of polarized electromechanical material in the form of a plate having a length L, a height H and a thickness T. The plate-shaped ultrasonic actuator comprises main surfaces that are largest in terms of area and side surfaces that are smaller in terms of area than the main surfaces and connect the main surfaces to each other, and of which at least two are longer than the remaining side surfaces. Disposed at one of the longer side surfaces are at least two friction elements which are provided for frictional contact with the element to be driven.

Furthermore, the plate-shaped ultrasonic actuator comprises at least two generators Gl and Gr, which are each formed by at least one excitation electrode, at least one general electrode, and a layer of the electromechanical material arranged between the electrodes. Due to the properties of the electromechanical material in combination with its polarization, the ultrasonic actuator can be excited by applying electrical excitation voltage to the electrodes of generators Gl or Gr to form an acoustic standing wave usable for driving the element to be driven. Generators Gl and Gr are therefore generators for acoustic standing waves.

Each of generators Gl and Gr comprises two cooperating and spaced sub-generators, where one respective sub-generator of a generator is located between the sub-generators of an adjacent generator, and the sub-generators of one generator are arranged in mirror image to the sub-generators of an adjacent generator.

According to the invention, the polarization direction of the electromechanical material of one of the two sub-generators of one generator differs from the polarization direction of the electromechanical material of the other sub-generator of the same generator. By applying a suitable electrical voltage or suitable electrical voltages to the electrodes of the generators or of the sub-generators, it is possible for a diagonal transverse acoustic standing wave to be formed in the ultrasonic actuator. Periodic deformations of the ultrasonic actuator arise with these specific standing wave shapes essential to the invention, in the case of which the friction elements perform a substantially linear motion along trajectories that are inclined relative to the side surface on which the friction elements are arranged, where the periodic motions of the friction elements have a defined phase shift from one another. A phase shift of the motions of the friction elements of substantially 180° is there preferred, so that the two friction elements move in opposite direction to each other at almost any point in time.

It can be advantageous to have the polarization directions of the electromechanical material of the two sub-generators of a generator have an opposite or antiparallel orientation. In other words, the polarization directions of the electromechanical material of the two sub-generators of a generator extend in opposite direction to each other.

In addition, it can be advantageous for each of the generators to have a plurality of excitation electrodes and general electrodes, and a layer of electromechanical material is respectively disposed between adjacent electrodes. The electrical voltages for operating the ultrasonic motor can be significantly reduced with such a multilayer structure.

This simplifies the electrical connection of the electrode layers of the generators.

Furthermore, it can be advantageous to have the length L of the ultrasonic actuator correspond to 3.5 times to 3.9 times its height H. With this length-to-height or L/H ratio, a particularly efficient diagonal transverse standing wave can form in the ultrasonic actuator, which results in an ultrasonic motor having maximized power.

The invention also relates to a method for actuating the ultrasonic motor according to one of the preceding claims, comprising the following steps: providing an electrical excitation device for applying a voltage to the excitation electrodes and/or the general electrodes; and applying an electrical voltage to the sub-generators of generator Gl and/or to the sub-generators of generator Gr by way of the electrical excitation device, so that a diagonal transverse acoustic standing wave forms in the ultrasonic actuator and leads to a defined phase-shifted motion of the friction elements. A phase shift of the motions of substantially 180° is there preferred, so that an opposite motion of the two friction elements arises at almost any point in time. However, other phase shifts differing from 180° are also conceivable.

In this case, it can be advantageous for the electrical voltage provided by the electrical excitation device to be a harmonic or a non-harmonic alternating voltage. In this way, it is possible to selectively change the motion trajectories of the friction elements in order to thus have a favorable influence on the motion of the element to be driven.

Furthermore, it can be advantageous to apply two different electrical alternating voltages to the sub-generators of generators Gl and Gr, wherein it can be particularly advantageous for the alternating voltages to have a different amplitude and/or a different frequency and/or a different phase. In this way as well, it is possible to selectively change the motion trajectories of the friction elements in order to have a favorable influence on the motion of the element to be driven. When using alternating voltages or signals of different frequencies, respectively, further resonances or vibration modes of the ultrasonic actuator can be excited, whereby the efficiency of the motion of the friction elements or the efficiency of the ultrasonic motor as a whole can be increased.

BRIEF DESCRIPTION OF THE DRAWINGS

Advantages and expediencies of the invention will become more apparent from the following description of preferred embodiments with reference to the figures, where.

DETAILED DESCRIPTION

Figure 1:
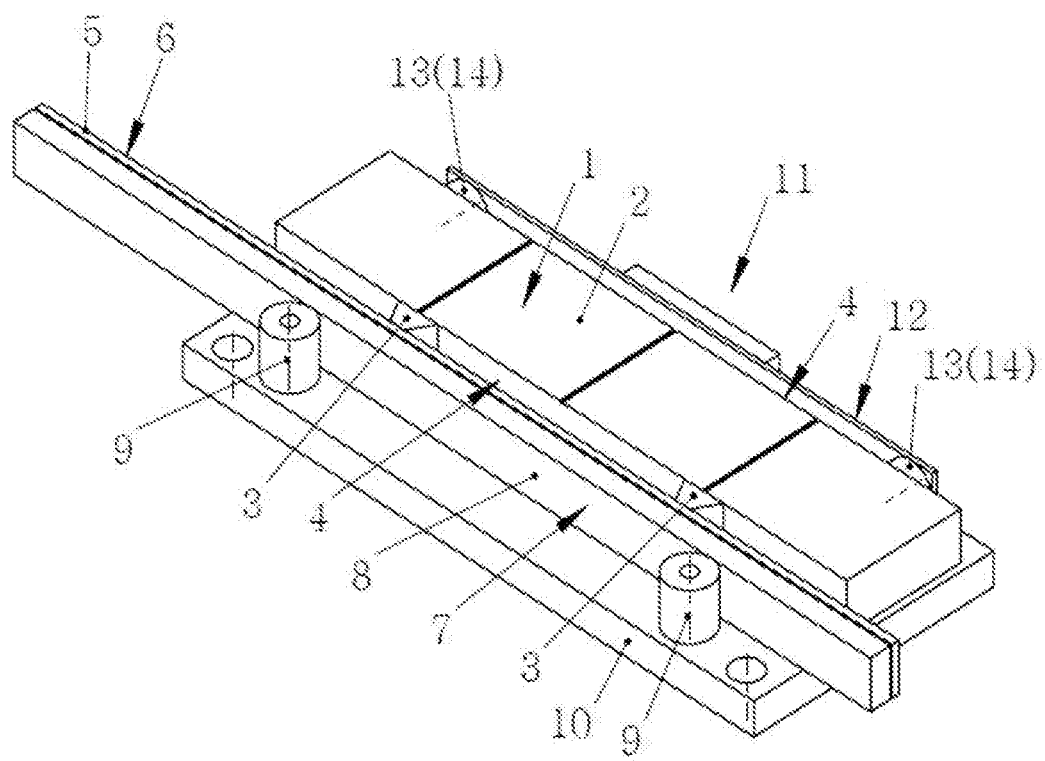
FIG. 1: shows an embodiment of an ultrasonic motor according to the invention.

FIG. 1 shows a possible embodiment of the ultrasonic motor according to the invention. The ultrasonic motor comprises an ultrasonic actuator 1 configured as a rectangular plate 2. The ultrasonic actuator is there made of electromechanical material in the form of piezoelectric ceramic material. Ultrasonic actuator 1 comprises two friction elements 3 which are arranged on one of its long side surfaces 4. Friction elements 3 are by way of a pressing device 11 pressed against friction surface 5 of abrasion-resistant layer 6 of element 7 to be driven, where pressing device 11 comprises a leaf spring 12 and insulating sleeves 13. Insulating sleeves 13 simultaneously form holding elements 14 for holding ultrasonic actuator 1.

Element 7 to be driven has the shape of a rod 8 which is mounted in bearings 9. Bearings 9 are arranged on a base plate 10.

Figure 2:
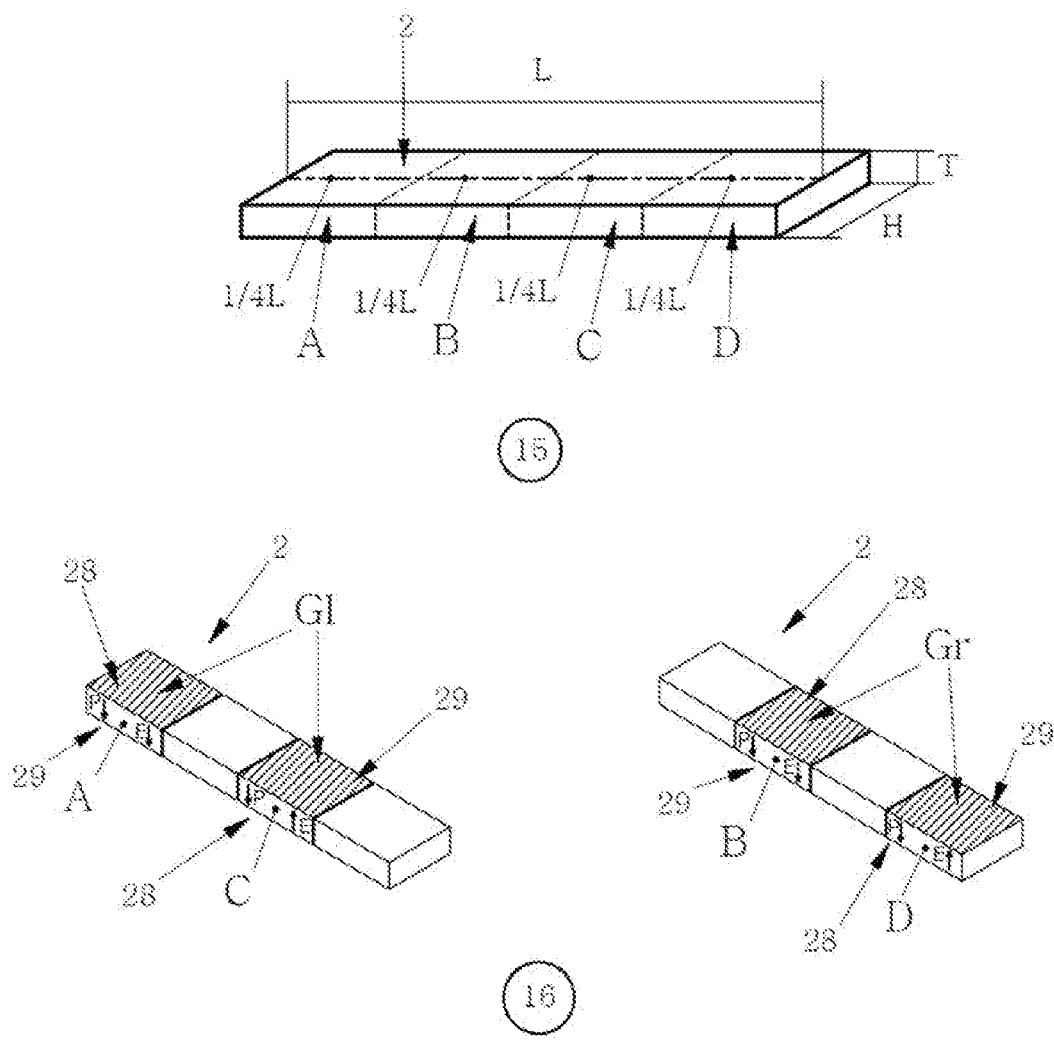
FIG. 2, Illustrations 15: dimensions of the ultrasonic actuator of an ultrasonic motor according to the invention; Illustration 16: ultrasonic actuator that is not part to the invention.

According to Illustration 15 of FIG. 2, length L of piezoceramic plate 2 of ultrasonic actuator 1—relative to the center line—is equal to the length of the diagonal transverse acoustic standing wave energized in the ultrasonic actuator. Height H of plate 2 is selected to be between 0.7×¼ L and ¼ L.

Piezoceramic plate 2 of actuator 1 is subdivided with respect to its length L into four zones which form sub-generators A, B, C and D. Sub-generators A and C as well as B and D, respectively, are identical in terms of the geometric dimensions, shape and electrode structure. Sub-generators A and C, as well as sub-generators B and D each represent mutually complementary sub-generators, from which generators Gl and Gr for an acoustic ultrasonic standing wave are formed. Complementary sub-generators A and C form generator Gl, while complementary sub-generators B and D form generator Gr. The two sub-generators A and C as well as B and D, respectively, of a generator Gl or Gr, respectively, can be electrically actuated independently of each other, but they complement each other to form the respective generator Gl or Gr of an acoustic standing wave. The length of each zone or sub-generator A, B, C, D is ¼ L.

The arrangement of the polarization directions in the individual sub-generators shown in Illustration 16 of FIG. 2 is no object of the invention.

Figure 3:
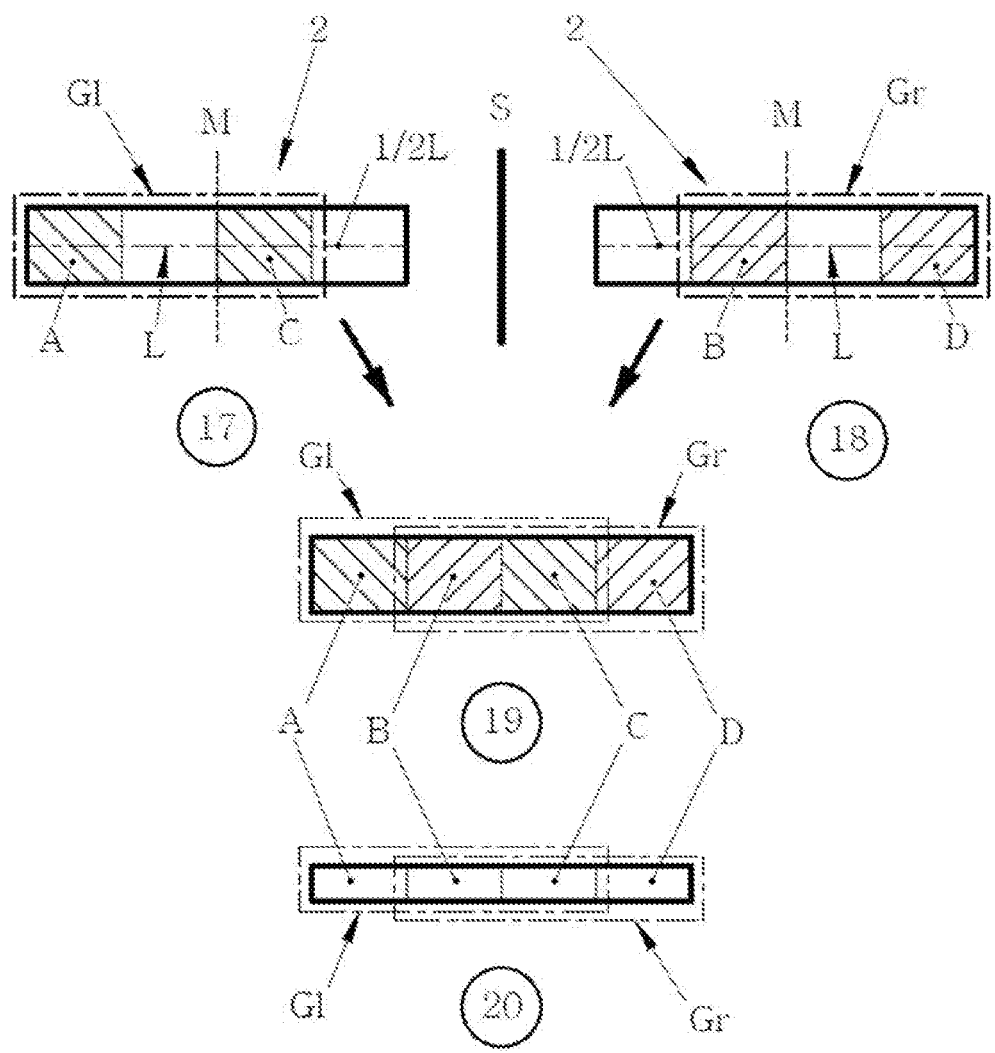
FIG. 3, Illustrations 17 to 20: geometry or geometric relationships of the ultrasonic actuator of an ultrasonic motor according to the invention.

FIG. 3 in Illustrations 17 to 20 explains the geometric properties of generators Gl and Gr. Each of generators Gl and Gr is arranged asymmetrically with respect to the plane of symmetry M of plate 2 which passes through the center of center line L, as shown in Illustrations 17 and 18 of FIG. 3. Therefore, generators Gl and Gr represent asymmetrical generators. Each of generators Gl and Gr represents the other generator in mirror image in mirror plane S. Plane S runs parallel to plane of symmetry M at a distance greater than ¼ L. Generator Gl shown in Illustration 17 is a mirror image of generator Gr shown in Illustration 18, while generator Gr shown in Illustration 18 is a mirror image of generator Gl shown in Illustration 17.

Generators Gl and Gr in piezoceramic plate 2 of ultrasonic actuator 1 intersect, as shown in Illustrations 19 and 20 of FIG. 3 The term "intersect" presently means that generators Gr and Gl overlap each other asymmetrically.

Figure 4:
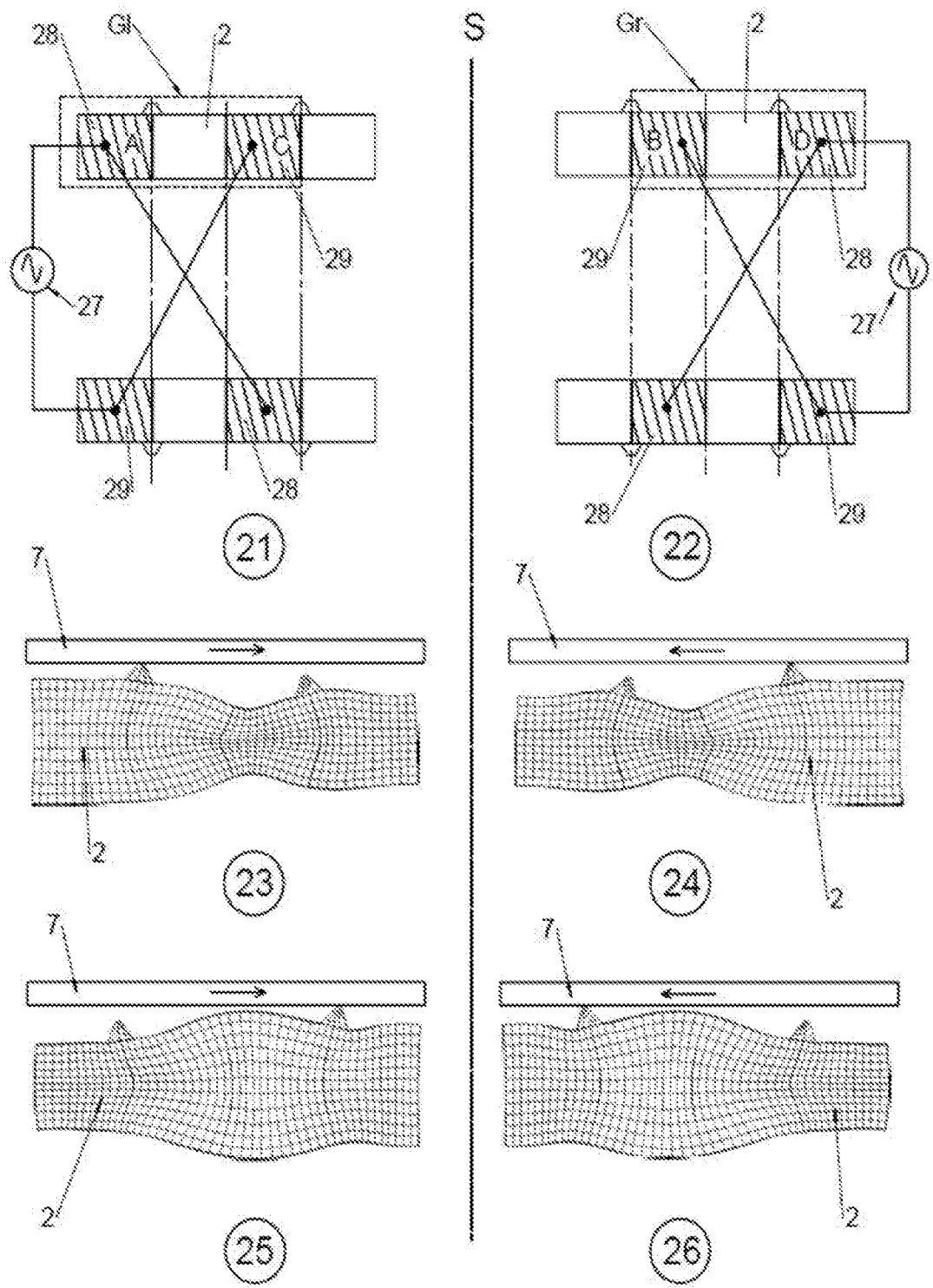
FIG. 4, Illustrations 21 and 22: actuation variants of the ultrasonic actuator of an ultrasonic motor according to the invention for obtaining different drive directions; Illustrations 23 and 25: simulations of the maximum deformations of the ultrasonic actuator for the actuation variant according to Illustration 21; Illustrations 24 and 26: simulations of the maximum deformations of the ultrasonic actuator for the actuation variant according to Illustration 22.

FIG. 4 in Illustrations 21 and 22 shows possible actuations of the ultrasonic actuator of an ultrasonic motor according to the invention with an electrical voltage having the frequency $\omega_r$ generated by an electrical excitation device 27, where $\omega_r$ is the operating frequency of actuator 1. Illustrations 23 and 25 show the calculated or simulated maximum deformations of plate 2 for an electrical actuation according to Illustration 21 of FIG. 4, whereas Illustrations 24 and 26 show the calculated or simulated maximum deformations of plate 2 for an electrical actuation according to Illustration 22 of FIG. 4.

An excitation electrode 28 and a reference electrode 29 of the ultrasonic actuator are each formed by metallized regions of its surface or its main surfaces, respectively. Illustrations 23 and 25 show the calculated deformations of plate 2 for the actuation by generator Gl, whereas Illustrations 24 and 26 show the calculated deformations of plate 2 for the actuation by generator Gr. The direction of the resulting motion of element 7 to be driven is indicated by an arrow.

Figure 5:
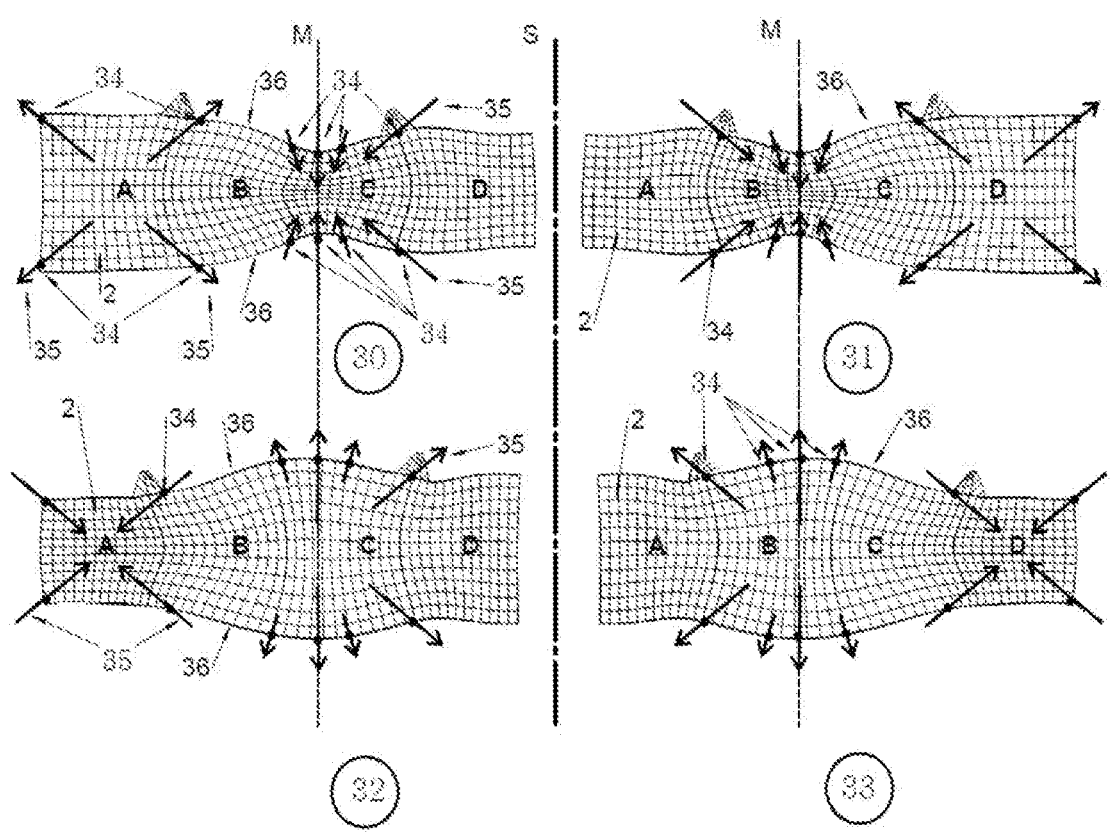
FIG. 5, Illustrations 30 to 33: detailed illustration of the directions of motion of individual surface points of the ultrasonic actuator with regard to the deformation simulations according to Illustrations 23 to 26 of FIG. 4.

FIG. 5 illustrates with arrows trajectories 35 of surface points 34 which are located on surfaces 36 of plate 2, namely, as shown in Illustrations 30 and 32 for the actuation by generator Gl, and according to Illustrations 31 and 33 for the actuation by generator Gr.

Figure 6:
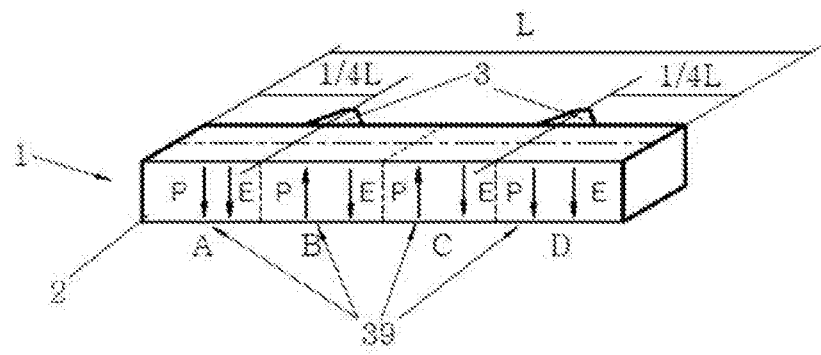
FIG. 6, Illustration 37: illustration of the polarization directions of the electromechanical material within the ultrasonic actuator of an ultrasonic actuator according to the invention; Illustration 38: embodiment of the electrodes of the ultrasonic actuator of an ultrasonic motor according to the invention.
Figure 6:
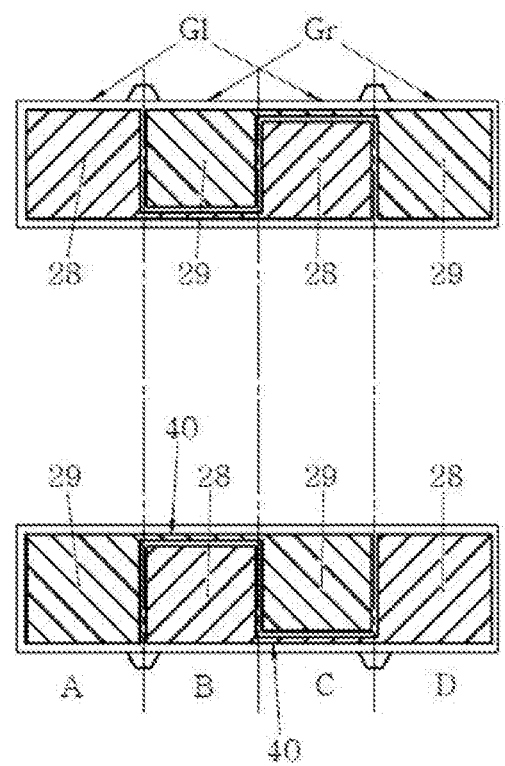

FIG. 6 illustrates with arrows the orientation of polarization vectors 39 (additionally marked with P) of the piezoelectric ceramic material within the various sub-generators A, B, C, D for an ultrasonic actuator 1 of an ultrasonic motor according to the invention. The directions of polarization vectors 39 or the polarization directions of the piezoelectric material, respectively, in sub-generators A and D are identical. Likewise, the directions of polarization vectors 39 or the polarization directions of the piezoelectric material, respectively, in sub-generators B and C are identical. However, polarization vectors 39 or the polarization directions of the piezoelectric material, respectively, in sub-generators A and D differ from those of sub-generators B and C such that they have an opposite or anti-parallel orientation.

In Illustration 37 of FIG. 6, the directions of electric field E generated in the respective sub-generator by application of an electrical voltage are additionally shown in the various sub-generators A, B, C and D. It then arises, that the polarization direction P and the direction of electric field E in sub-generators A and D are identical and run parallel to each other, whereas the polarization direction P in sub-generators B and C is equally parallel but opposite or antiparallel to the direction of electric field E.

However, it is also possible according to Illustration 16 of FIG. 2 that polarization direction P in all sub-generators A, B, C and D is identical, and, in particular, that polarization directions P in the two sub-generators of one generator are identical, where it is explicitly pointed out that an ultrasonic motor with such a polarized ultrasonic actuator is no part of the invention. In order to generate the diagonal transverse standing wave essential to the invention in sub-generators thus polarized, electric fields E resulting from the electrical voltages applied to the electrodes of the sub-generators are adapted accordingly, as shown in Illustration 16 of FIG. 2. According thereto, polarization directions P and the directions of electric field E in the two sub-generators A and B are identical, whereas they run opposite to each other in the other two sub-generators C and D.

As shown in Illustration 38 of FIG. 6, excitation electrode 28 and reference electrode 29 of sub-generators A, B, C and D are electrically connected to each other by a narrow surface connection 40.

Figure 7:
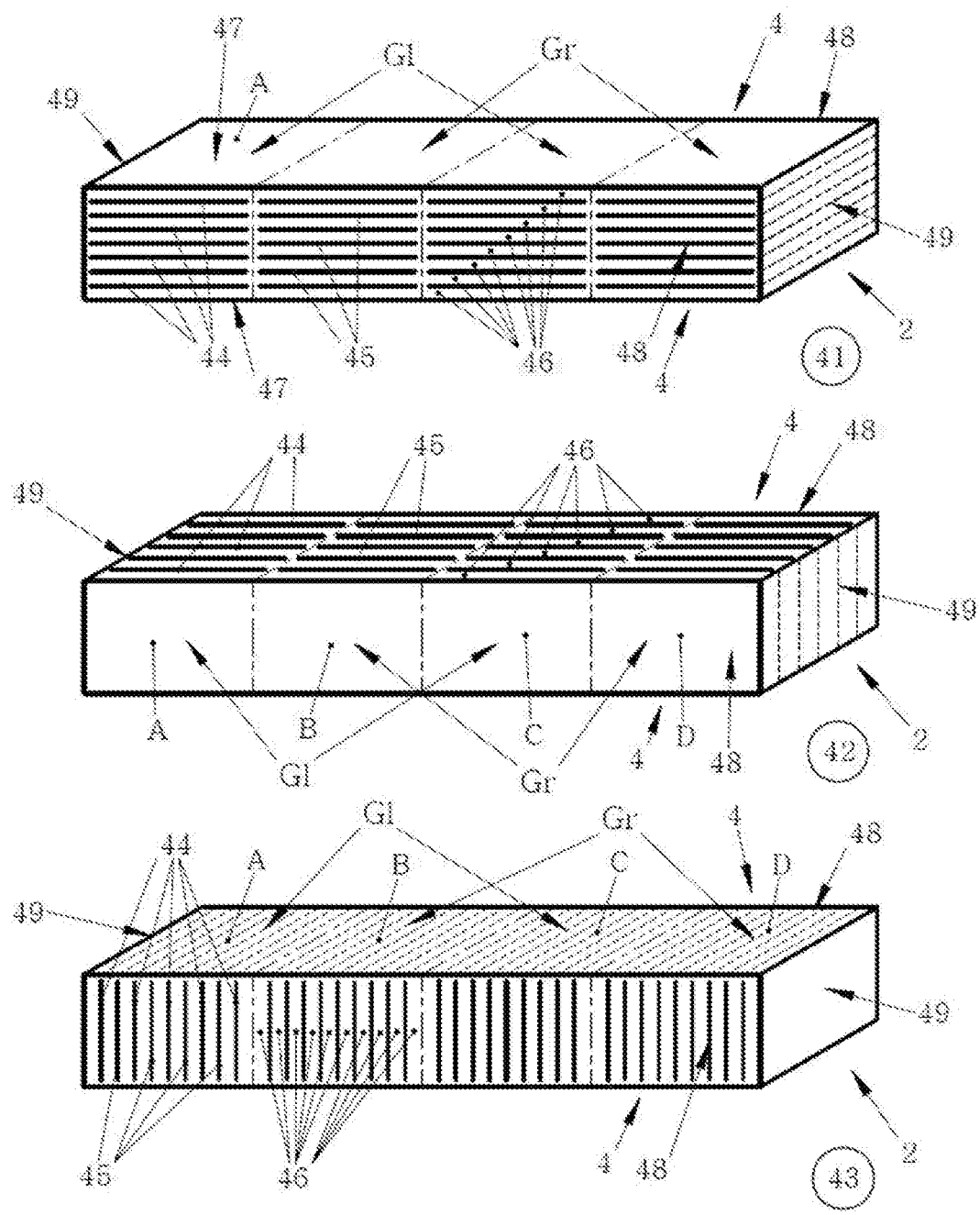
FIG. 7, Illustrations 41 to 43: different multilayer embodiments of the ultrasonic actuator of an ultrasonic motor according to the invention.

FIG. 7 in Illustrations 41 to 43 shows different embodiments of an ultrasonic actuator of multilayer design of an ultrasonic motor according to the invention. Each of generators Gl and Gr consists of numerous layers of inner excitation electrodes 44 and inner reference electrodes 45, where a piezoceramic layer 46 is respectively arranged between adjacent excitation electrodes and reference electrodes.

The thickness of a single piezoceramic layer 46 is preferably between 20 and 200 microns, while the thickness of metal electrodes 44 and 45 is preferably between 0.5 and 10 microns. The piezoceramic material preferably has a low sintering temperature between 800 and 1000° C. The electrode material used is preferably palladium or a mixture of palladium and silver.

Layers 44, 45, 46 can be arranged according to Illustration 41 of FIG. 7 parallel to main surfaces 47 of plate 2, or according to Illustration 42 of FIG. 7 parallel to side surfaces 48 of plate 2, or according to Illustration 43 of FIG. 7 parallel to face surfaces 49 of plate 2 or ultrasonic actuator, respectively.

Figure 8:
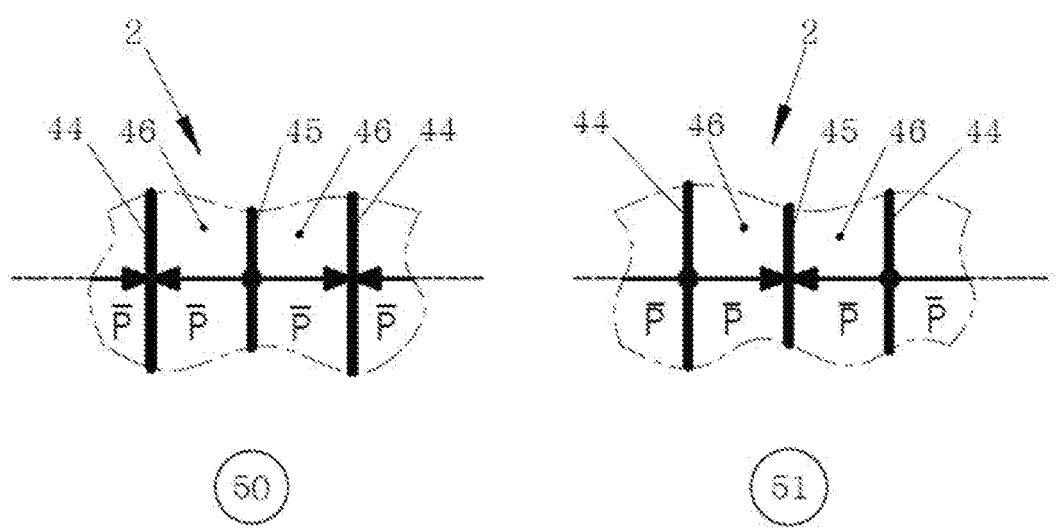
FIG. 8, Illustrations 50 and 51: illustration of possible polarization directions within the layers of electromechanical material of an ultrasonic actuator of multilayer design of an ultrasonic motor according to the invention.

Two possible arrangements of polarization vectors P or the polarization directions of piezoceramic layers 46 between electrodes 44 and 45 are indicated by arrows in Illustrations 50 and 51 of FIG. 8. It can be seen that the polarization directions or directions of polarization vectors P, respectively, run substantially perpendicular to the surface of excitation electrodes 44 and reference electrodes 45. In Illustration 50 of FIG. 8, polarization vectors P run in a direction facing away from respective reference electrode 45, and in Illustration 51 of FIG. 8, polarization vectors P run in a direction toward the respective reference electrode. In general, the orientation of polarization vectors P in the different sub-generators can differ from each other.

Figure 9:
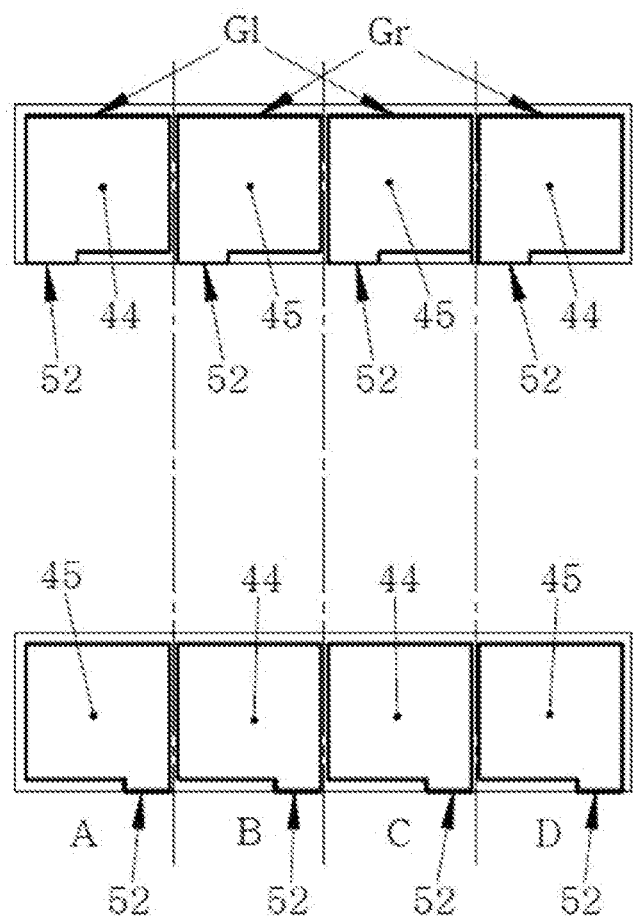
FIG. 9: embodiment of the electrodes of an ultrasonic actuator of multilayer design of an ultrasonic motor according to the invention with multiple layers formed parallel to the main surfaces of the ultrasonic actuator.
Figure 9:
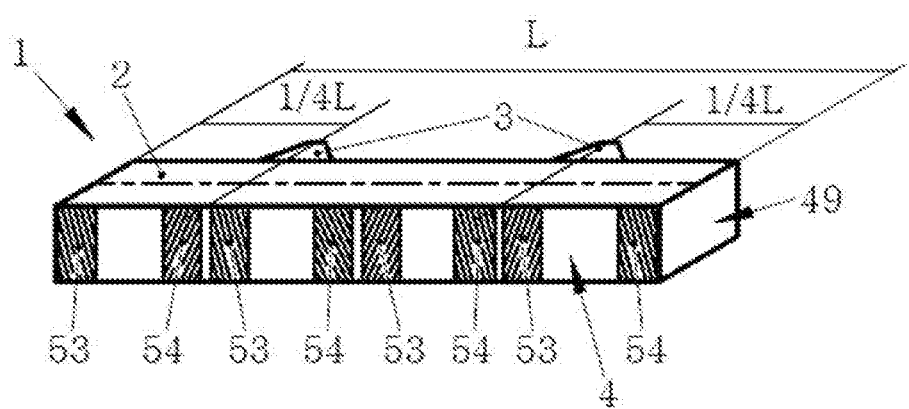

FIG. 9 shows possible shapes of inner electrodes 44 and 45, i.e. embedded in the ultrasonic actuator, for electrode or material layers extending in parallel to main surfaces 47 for a multilayer actuator 1 of an ultrasonic motor according to the invention, where two friction elements 3 are arranged on one of its long side surfaces 4. All electrodes 44, 45 have projections 52 which serve to connect electrodes 44, 45 to outer contact surfaces 53, 54.

Figure 10:
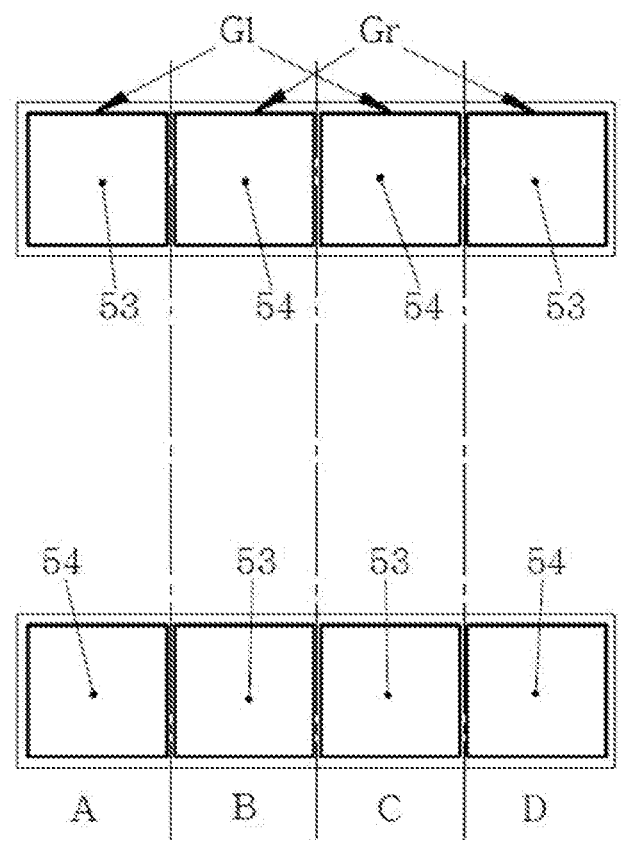
FIG. 10: embodiment of the electrodes of an ultrasonic actuator of multilayer design of an ultrasonic motor according to the invention with multiple layers formed parallel to the long side surfaces of the ultrasonic actuator.
Figure 10:
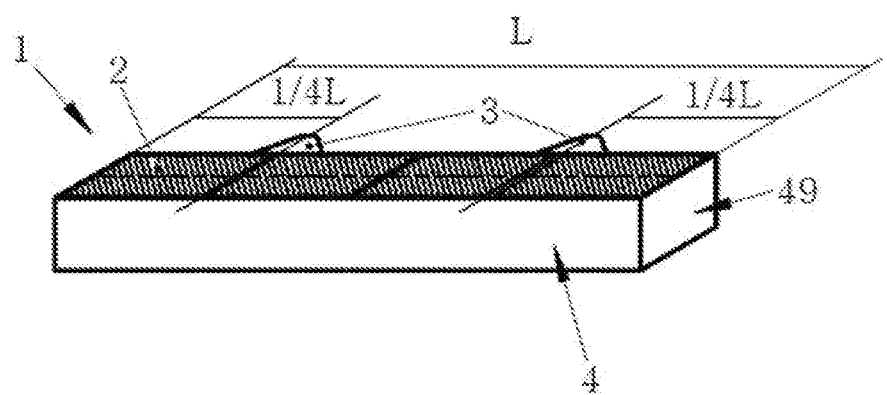

FIG. 10 illustrates a possible outer contact 53, 54 of inner electrodes to layers of electrodes running parallel to side surfaces 4 and material layers arranged therebetween for a multilayer actuator 1. The layers of the inner electrodes are for contacting extended directly out onto both main surfaces 47 of the multilayer plate.

In order to prevent electrical spark-over between the electrodes and surfaces of multilayer plates 2, the surface of the plates can be covered with a thin layer of glass.

Figure 11:
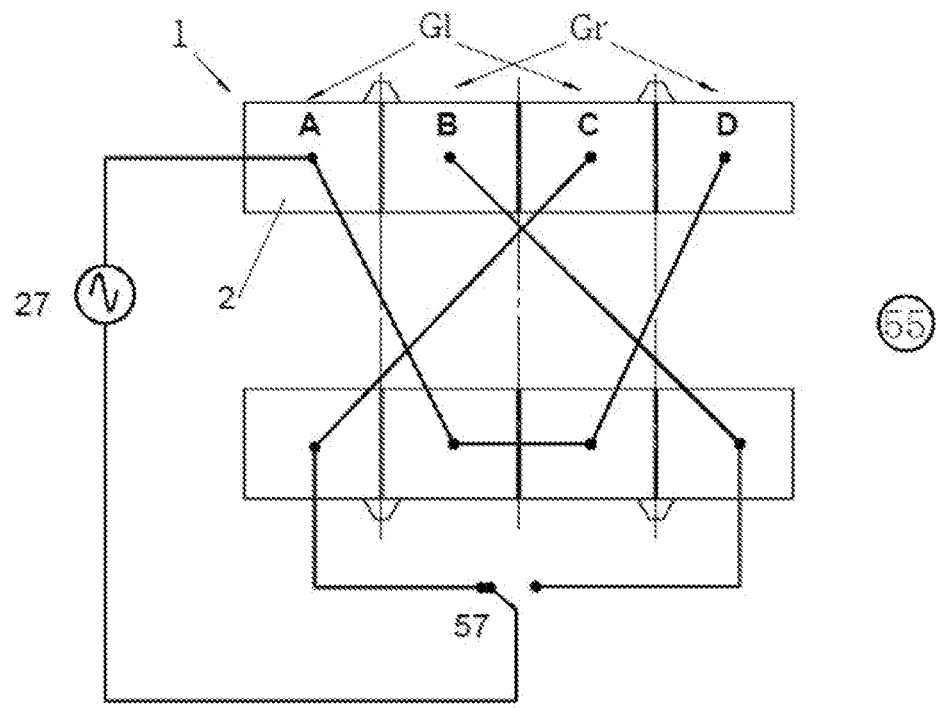
FIG. 11, Illustrations 55 and 56: different actuation variants of the ultrasonic actuator of an ultrasonic motor according to the invention with an electrical excitation device or voltage source, respectively.
Figure 11:
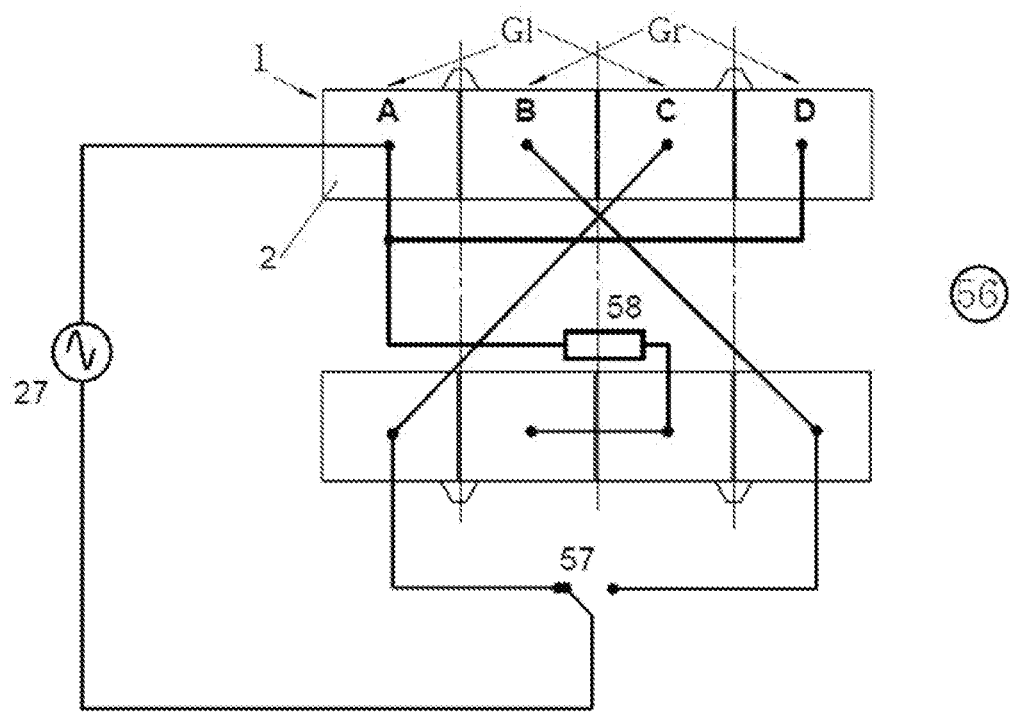

FIG. 11 in Illustrations 55 and 56 shows a possible electrical circuit for connecting an ultrasonic actuator 1 of an ultrasonic motor according to the invention to an electrical excitation device 27 for respective electrical actuations. The circuit comprises a changeover switch 57 for generators Gl and Gr. Electrical excitation device 27 provides a harmonic or sinusoidal excitation voltage U having the frequency $\omega_r$, but non-harmonic excitation voltages, which contain other harmonics or frequencies in addition to $\omega_r$, are also conceivable. In Illustration 55 of FIG. 11, the sub-generators of generators Gl and Gr are connected directly to electrical excitation device 27, while in illustration 56 of FIG. 11, an impedance element 58 is arranged between ultrasonic actuator 1 and electrical excitation device 27.

Figure 12:
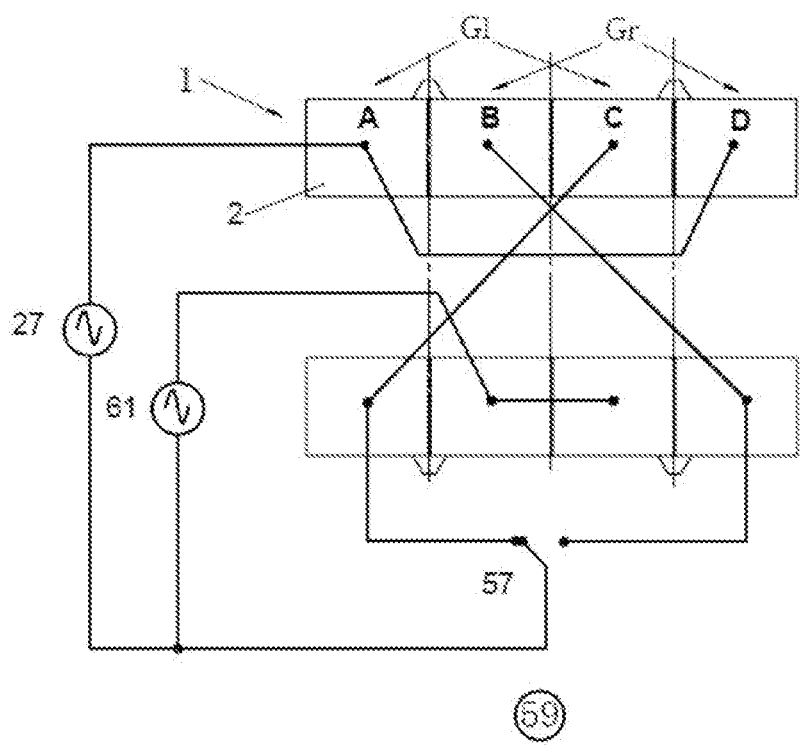
FIG. 12, Illustrations 59 and 60: different actuation variants of the ultrasonic actuator of an ultrasonic motor according to the invention with two electrical excitation devices or voltage sources, respectively.
Figure 12:
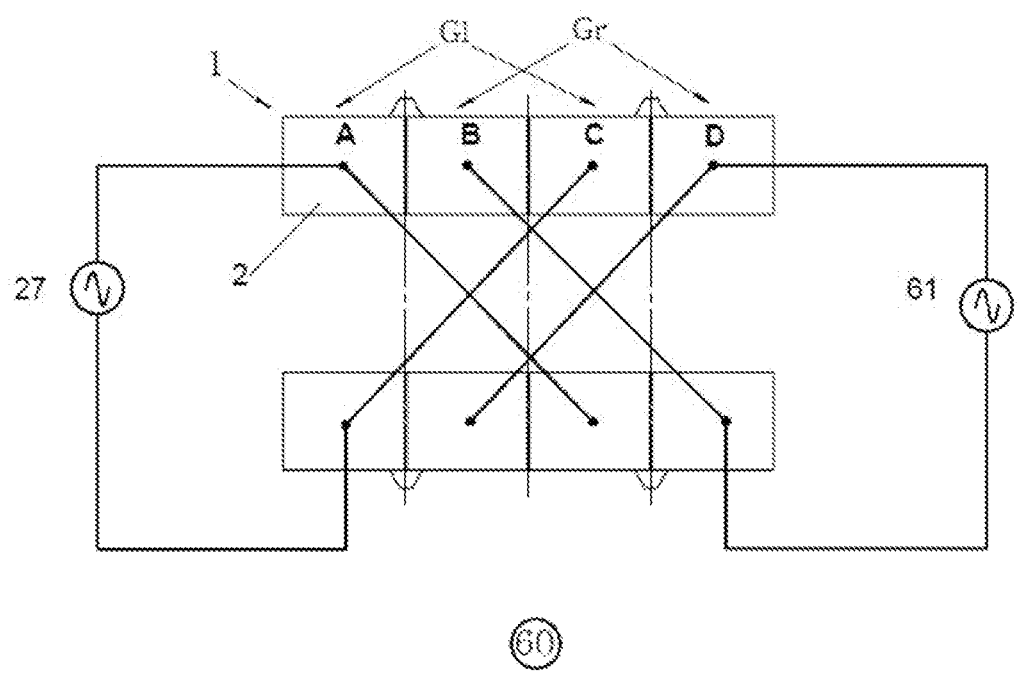

FIG. 12 in Illustrations 59 and 60 shows two different electrical circuits for connecting actuator 1 to two electrical excitation devices 27 and 61 for respective actuation. In Illustration 59 of FIG. 12, the sub-generators of generators Gl and Gr are connected to excitation devices 27 and 61. The circuit comprises a changeover switch 57 for generators Gl and Gr. In the electrical circuit according to Illustration 60 of FIG. 12, generators Gl and Gr are connected to excitation devices 27 and 61.

When the electrodes of ultrasonic actuator 1 are applied the electrical alternating voltage of excitation device 27, the frequency of which corresponds to the resonance frequency $\omega_r$ of the diagonal transverse acoustic standing wave to be excited in the ultrasonic actuator, the diagonal transverse acoustic standing wave is formed accordingly in the ultrasonic actuator.

The excitation of the diagonal transverse acoustic standing wave is effected with the aid of the appropriate electrical actuation of the complementary sub-generators A and C or Ba and D, respectively, of generators Gl and/or Gr. The length L of actuator 1 determines the length of the excited diagonal transverse wave.

Each sub-generator A, B, C, D comprises either said two electrodes 28 and 29 with piezoelectric ceramic material disposed therebetween or, in the case of a multilayer actuator, a plurality of alternating electrodes 44 and 45 and a layer of piezoelectric ceramic material 46 respectively disposed between two adjacent electrodes according to FIG. 7. In the case of a multi-layer actuator, significantly lower exciter voltages are required for a maximum deformation of actuator 1. Actuator 1 is excited over its entire volume, where the electric field is concentrated in the interior of actuator 1 and does not reach the exterior.

In the case of a multilayer actuator, layers of excitation electrodes 44, reference electrodes 45, and piezoceramic layers 46 therebetween can be disposed as shown in Illustrations 41 through 43 of FIG. 7. The varied arrangement of these layers makes it possible to change the efficiency of the excitation of the diagonal transverse standing wave, whereby the height of the excitation voltage U is changed in the direction of the region of lower voltage values.

In the diagonal transverse standing wave excited according to the invention, surface points 34 located on surface 36 of ultrasonic actuator 1 move on the substantially linear trajectories 35 marked with arrows in FIG. 5.

The excited diagonal transverse acoustic standing wave has characteristic features that distinguish it from other standing waves known in prior art. For instance, the material points of the first quarter of the ultrasonic actuator (see Illustrations 30 and 32 of FIG. 5 in region A) vibrate along the diagonal trajectories marked with arrows.

At the center of plate 2, the diagonal transverse standing wave has a maximum of vertical vibration velocities (see Illustrations 30 and 32 of FIG. 5 in regions B and C), and the horizontal vibration velocity of points 34 on plate surface 36 is zero or substantially zero, respectively. Laterally from the center of the plate and symmetrically with respect to the plane of symmetry M, points 34 of plate 2 have both a horizontal and a vertical vibration amplitude. They therefore vibrate inclined at an angle relative to plate surface 36, but in mirror image to each other.

Located on the right-hand side of the plate at a distance greater than ¼L from the center of plate M (region D) is a node. The horizontal and the vertical vibration velocity is there identical or nearly identical to zero.

The diagonal transverse standing wave thus generated has not previously been used in the previously known ultrasonic motors with an ultrasonic actuator in the form of a piezoelectric plate.

In the ultrasonic motor according to the invention, friction elements 3 are arranged symmetrically at a distance ¼L from the center of plate 2 of actuator 1, as shown in FIG. 1. Upon electrical excitation by generator Gl and/or generator Gr, the friction elements 3 move or vibrate inversely phased on trajectories inclined to friction surfaces 5.

The underlying drive mechanism of the ultrasonic motor according to the invention can be described as follows: due to the diagonal transverse standing wave specific to the invention and excited in the ultrasonic actuator, the two friction elements arranged on one of the long side surfaces move analogously to the periodic deformations excited in the ultrasonic actuator on trajectories inclined relative to the side surface, where, however, the motions of the two friction elements are shifted in phase relative to each other. With a motion or displacement of one of friction elements 3 in the direction toward the element to be driven or its friction surface 5, respectively, friction element 3 comes into frictional contact with friction surface 5 of element 7 to be driven and pushes or drives it ahead in the desired drive direction, i.e. in the direction of the inclination of the trajectory. This friction element therefore becomes a driving friction element during the temporal phase of contact with the element to be driven. The other friction element moves on a trajectory similarly inclined to the driving friction element, but with a phase shift relative to the previously described motion of the driving friction element.

In the temporal phase of contact of the driving friction element with the element to be driven or in the phase of driving the element to be driven, the other friction element is preferably out of contact with the friction surface of the element to be driven. This friction element is therefore a non-driving friction element for a certain temporal phase.

After the driving friction element has experienced its maximum deflection along the inclined trajectory, a respective reverse motion in the opposite direction takes place along the same trajectory, so that the driving friction element is out of contact or out of engagement with the element to be driven at a certain point in time.

The actuation can be effected such that the non-driving friction element moving in a phase-shifted manner relative to the driving friction element comes into contact or engagement with the element to be driven already slightly prior to the point in time when the driving friction element is out of contact due to its reverse motion, so that both friction element are in contact or engagement with the element to be driven for one short moment of transition or handover, comparable to the transfer of a baton during a relay race, when both relay runners are holding on to the baton for a brief moment. In the further course, the previously driving friction element then detaches from the friction surface of the element to be driven, and the previously non-driving friction element, which is already in contact with the friction surface of the element to be driven, now becomes the driving friction element for a certain period of time. Multiple repetitions of the procedure outlined above results in a substantially continuous motion of the element to be driven.

An actuation of the ultrasonic actuator of the ultrasonic motor according to the invention is advantageous where the non-driving friction element comes into contact or engagement with the friction surface of the element to be driven only when the previously driving friction element is no longer in contact with the element to be driven. This means that there is a short period of time in which neither of the two friction elements is in contact with the element to be driven. However, within this short period of time, there is therefore no significant interruption of the drive motion of the element to be driven, because the element to be driven continues moving in the drive direction due to its inertia.

The speed of motion of element 7 to be driven and the driving force generated depend significantly on the inclination angle of the trajectory of friction elements 3 relative to friction surface 5 of abrasion-resistant layer 6 of element 7 to be driven. This angle is determined by the ratio of length L of plate 2 to height H.

Experimental trials have shown that the ultrasonic motor according to the invention develops its maximum speed and maximum force at a ratio of L/H between 3.5 and 3.9. These experimental trials were carried out using actuators with a plate-shaped ultrasonic actuator having the dimensions L=35 mm, H=9 mm and D=4 mm. The plate consisted of piezoceramic material type PIC 181 from PI Ceramic GmbH, Lindenstraße, 07589 Lederhose. The optimum ratio of L/H depends on the length L of the plate and on the piezoceramic material.

The operating frequency of actuator 1 can be determined according to the formula $\omega_r = N/L$, where N represents the frequency constant of the excited asymmetric wave. For actuator 1 made of piezoceramic material type PIC 181, the frequency constant is 6400 Hzm.

In the ultrasonic motor according to the invention, piezoceramic plate 2 of ultrasonic actuator 1 has two asymmetric generators Gl and Gr arranged in mirror-symmetry for ultrasonic vibrations. With such a setup of ultrasonic actuator 1, it is possible with the aid of one of generators Gl or Gr to generate a diagonal transverse standing wave therein which is a mirror image of the diagonal transverse standing wave which can be generated by the corresponding other generator Gr or Gl. Where the two generators Gl and Gr can be actuated entirely independently of each other.

Due to the above, it is possible to reverse the inclination angle of trajectory 35 of material points 34 located on surface 36 of plate 2 and thereby change the inclination angle of the trajectories of friction elements 3 or the trajectories of the points of friction elements 3. The change in the inclination angle is effected by simply switching generators Gl and Gr by way of changeover switch 57. The diagonal transverse standing wave generated changes its shape in a mirror-image manner. The reversal of the inclination angle of trajectory 35 makes it possible to reverse the direction of motion of element 7 to be driven. Where the motor retains its motion parameters, i.e. speed and driving force.

In the ultrasonic motor according to the invention, it is also conceivable to arrange at least two respective friction elements not only at one of the long side surfaces, but at both long and oppositely disposed side surfaces.

In principle, the ultrasonic motor according to the invention can also comprise an ultrasonic actuator which in its geometric shape differs from the rectangular plate sketched in the figures. It is there only important that it is ensured that the standing wave excited by one generator represents a mirror image of the standing wave generated by the other generator. Therefore, the piezoelectric plate of the actuator can also be rectangular or part of a ring.

The excitation voltage applied to the ultrasonic actuator of an ultrasonic motor according to the invention can be a harmonic (sinusoidal) signal or a non-harmonic signal. According to Illustration 55 of FIG. 11, a sinusoidal excitation voltage from excitation device 27 via changeover switch 57 reaches generator G1 and excites a diagonal transverse standing wave therein. By switching changeover switch 57, the excitation of generator Gl is interrupted, and generator Gr is electrically excited instead. The direction of rotation of the element to be driven is reversed.

It is additionally possible for excitation device 29 in Illustration 55 of FIG. 11 to generate an excitation voltage with two frequencies, i.e. a non-harmonic signal. The first frequency corresponds to the working resonance frequency $\omega_r$ of the actuator at which the diagonal transverse standing wave is excited. The second frequency corresponds to a further resonance frequency of the actuator at which the friction elements likewise vibrate. By exciting the further vibration modes, the trajectory of the friction elements arising due to the working resonance is additionally superimposed by the trajectory resulting from the other resonance. The element to be driven thereby changes its motion. It accelerates or decelerates. Such an excitation of further specially selected vibration modes of the ultrasonic actuator can be used selectively to influence the motion of the element to be driven, e.g. for the compensation of stick-slip effects during slow driving or fine positioning. Excitation device 27 can generate an arbitrarily shaped signal, for example, a square wave signal or a triangular wave signal.

With a non-harmonic waveform, the excitation voltage can also include higher harmonics or other frequencies apart from the fundamental frequency $\omega_0$. For efficient operation of the ultrasonic motor according to the invention, it is advantageous to keep the fundamental frequency $\omega_0$ of the excitation voltage U equal to the resonance frequency $\omega_r$ of the diagonal transverse acoustic standing wave, which is equal to the operating frequency $\omega_b$ of actuator 1.

FIG. 11 in Illustration 56 illustrates the excitation of the complementary sub-generators of generators Gl, Gr by way of an impedance element 58. The electrical excitation voltage reaches sub-generator A directly from the excitation device. Sub-generator C is excited by way of an impedance device which changes the phase and/or the amplitude of the exciter signal relative to sub-generator A. As a result, the diagonal transverse standing wave changes its shape within certain limits, and friction elements 3 move along changed trajectories. It is then possible to set different trajectories for the two friction elements (which differ from one another, for example, with respect to the inclination and/or the amplitude), and thus to influence the motion of the element to be driven in a selected manner.

It is also possible to excite the sub-generators of generators Gl and Gr or generators Gl, Gr themselves with two separate electrical exciter sources, such as shown in Illustration 59 of FIG. 12. The sub-generators of generators Gl and Gr are there excited by two harmonic voltages of different amplitudes and/or different phases and/or different frequencies provided by excitation devices 27 and 61. Such an excitation can be used selectively for influencing the trajectories of the friction elements and thus the motion of the element to be driven, e.g. for the compensation of stick-slip effects during slow driving or for fine positioning applications. Excitation devices 27 and 61 can generate a square wave signal, a triangular wave signal, or a signal of any shape.

A further advantageous embodiment of the actuation of an ultrasonic actuator of an ultrasonic motor according to the invention is shown in FIG. 12 in Illustration 60. Here, generators G1 and G5 are also electrically excited with two separate excitation devices 27 and 61. The actuation voltages can have a different amplitude and/or a non-zero phase angle. The reversal of the direction of motion of the element to be driven is done by reversing the phase angle between the two signals by a value of 180 degrees. It is there also possible to excite the two generators Gl and Gr with two signals of different frequencies. As a result, other resonances, in addition to the resonance of the diagonal transverse standing wave, are also excited with the aim of superimposing the motion trajectories of the friction elements of different resonances. Such an excitation can be used selectively to influence the motion of the element to be driven, e.g. for the compensation of stick-slip effects during slow driving or fine positioning. Excitation devices 27 and 61 can generate a square wave signal or a triangular wave signal; other shapes of voltage signals are also conceivable.

In the ultrasonic motor according to the invention, the ratio of the length L of the ultrasonic actuator to the height H is smaller than in the ultrasonic actuator known from publication WO 2009/109606 A1. Therefore, the ultrasonic motor according to the invention has a smaller length at the same height. A smaller length is very advantageous in miniaturized mechanical drive systems and is often an important selection criterion. Furthermore, the mechanical performance of the ultrasonic motor according to the invention is higher than that of the ultrasonic motor disclosed in document WO 2009/109606 A1 because the friction elements do not vibrate synchronously and therefore not decelerate each other. The ultrasonic motor according to the invention therefore also develops less running noise and is more robust with respect to the regulation of speed, force or position of the element to be driven.

Various modifications of the above-described embodiments of the ultrasonic motor according to the invention that are apparent to the person skilled in the art are conceivable. For instance, it is conceivable that the ultrasonic actuator of an ultrasonic motor according to the invention has a geometry that differs from a plate-shaped geometry, for example, has the shape of a rod with a square, rectangular, polygonal, circular or oval cross-sectional shape. It is furthermore conceivable that the ultrasonic actuator of an ultrasonic motor according to the invention has more than two generators Gl and Gr and accordingly comprises more than four sub-generators A, B, C and D. In addition, it is conceivable that the ultrasonic actuator of an ultrasonic motor according to the invention has more than two friction elements, which perform a motion in pairs that is shifted in phase.

The invention claimed is:

1. An ultrasonic motor, comprising:
an element to be driven;
an ultrasonic actuator made of polarized electromechanical material in the form of a plate having a length L, a height H and a thickness T, and with main surfaces, and side surfaces that are smaller in terms of area than said main surfaces and connect said main surfaces to each other;
at least two friction elements arranged on at least one of said side surfaces and provided for frictional contact with said element to be driven;
at least two generators (Gl, Gr) which are each formed of an excitation electrode, a general electrode, and electromechanical material disposed between said excitation electrode and said general electrode, such that said ultrasonic actuator can be excited by applying electrical excitation voltage to said electrodes of said at least two generators (Gl, Gr) to form an acoustic standing wave usable for driving said element to be driven; and
each of said at least two generators (Gl, Gr) having first and second cooperating and spaced sub-generators, the first sub-generator of a generator of said at least two generators being respectively located between the first and second sub-generators of an adjacent generator of said at least two generators; and the first and second sub-generators of one generator of said at least two generators being arranged in mirror image to the first and second sub-generators of an adjacent generator of said at least two generators;
wherein a polarization direction of electromechanical material of the first sub-generator of one generator of said at least two generators (Gl, Gr) differs from a polarization direction of electromechanical material of the second sub-generator of the same generator (Gl, Gr).

2. The ultrasonic motor according to claim 1, wherein the polarization directions of said electromechanical material of the first and second sub-generators of said at least two generators (Gl, Gr) run opposite to each other.

3. The ultrasonic motor according to claim 1, wherein each of said at least two generators (Gl, Gr) comprises:
a plurality of excitation electrodes and general electrodes, and a layer of electromechanical material is respectively arranged between adjacent electrodes.

4. The ultrasonic motor according to claim 3, wherein the polarization directions within adjoining layers of electromechanical material run opposite to each other.

5. The ultrasonic motor according to claim 1, wherein the length L of said ultrasonic actuator corresponds to 3.5 times to 3.9 times its height H.

6. A method for actuating an ultrasonic motor having an element to be driven; an ultrasonic actuator made of polarized electromechanical material in the form of a plate having a length L, a height H and a thickness T, and with main surfaces, and side surfaces that are smaller in terms of area than said main surfaces and connect said main surfaces to each other; at least two friction elements arranged on at least one of said side surfaces and provided for frictional contact with said element to be driven; at least two generators (Gl, Gr) which are each formed of an excitation electrode, a general electrode, and electromechanical material disposed between said excitation electrode and said general electrode, such that said ultrasonic actuator can be excited by applying electrical excitation voltage to said electrodes of said at least two generators (Gl, Gr) to form an acoustic standing wave usable for driving said element to be driven; and each of said at least two generators (Gl, Gr) having first and second cooperating and spaced first and second sub-generators, the first sub-generator of a generator of said at least two generators being respectively located between the first and second sub-generators of an adjacent generator of said at least two generators; and the first and second sub-generators of one generator of said at least two generators being arranged in mirror image to the first and second sub-generators of an adjacent generator of said at least two generators;

wherein a polarization direction of electromechanical material of the first sub-generator of one generator of said at least two generators (Gl, Gr) differs from a polarization direction of electromechanical material of the second sub-generator of the same generator (Gl, Gr), the method comprising:

providing an electrical excitation device for applying an electrical voltage to said excitation electrodes and/or said general electrodes;

applying an electrical voltage to the first and second sub-generators of said at least two generators (Gl, Gr) by way of said electrical excitation device so that a diagonal transverse acoustic standing wave is formed in said ultrasonic actuator by which said friction elements each perform a motion along a trajectory that is inclined relative to said side surface on which said friction elements are arranged such that a defined phase shift is given between the motions of said friction elements.

7. The method according to claim 6, wherein the phase shift between the motions of said friction elements is substantially 180°.

8. The method according to claim 6, comprising:
providing a harmonic or a non-harmonic alternating voltage by said electrical excitation device.

9. The method according claim 6, comprising:
applying two different alternating voltages to said first and second sub-generators of said at least two generators (Gl, Gr).

10. The method according to claim 9, wherein said two alternating voltages have a different amplitude and/or a different frequency and/or a different phase.

11. The ultrasonic motor according to claim 2, wherein each of said at least two generators (Gl, Gr) comprise:
a plurality of excitation electrodes and general electrodes, and a layer of electromechanical material is respectively arranged between adjacent electrodes.

12. The ultrasonic motor according to claim 11, wherein the length L of said ultrasonic actuator corresponds to 3.5 times to 3.9 times its height H.

13. The method according to claim 7, comprising:
providing a harmonic or a non-harmonic alternating voltage by said electrical excitation device.

14. The method according claim 13, comprising:
applying two different alternating voltages to said first and second sub-generators of said at least two generators (Gl, Gr).

* * * * *